United States Patent
Azpiroz et al.

(10) Patent No.: US 11,052,391 B2
(45) Date of Patent: *Jul. 6, 2021

(54) RECONFIGURABLE MICROFLUIDIC DEVICE AND METHOD OF MANUFACTURING THE SAME

(71) Applicant: International Business Machines Corporation, Armonk, NY (US)

(72) Inventors: Jaione Tirapu Azpiroz, Rio de Janeiro (BR); Peter William Bryant, Rio de Janeiro (BR); Rodrigo Neumann Barros Ferreira, Rio de Janeiro (BR); Ronaldo Giro, Rio de Janeiro (BR); Ricardo Luis Ohta, Sao Paulo (BR)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 133 days.

This patent is subject to a terminal disclaimer.

(21) Appl. No.: 16/357,745

(22) Filed: Mar. 19, 2019

(65) Prior Publication Data
US 2019/0210024 A1     Jul. 11, 2019

Related U.S. Application Data

(63) Continuation of application No. 15/977,046, filed on May 11, 2018, now Pat. No. 10,343,162, which is a
(Continued)

(51) Int. Cl.
*B01L 3/00* (2006.01)
*B81B 1/00* (2006.01)
(Continued)

(52) U.S. Cl.
CPC ... *B01L 3/502746* (2013.01); *B01L 3/502707* (2013.01); *B01L 3/502715* (2013.01);
(Continued)

(58) Field of Classification Search
CPC ......... B01L 2200/06; B01L 2200/0652; B01L 2200/0668; B01L 2200/12;
(Continued)

(56) References Cited

U.S. PATENT DOCUMENTS

2009/0123334 A1 * 5/2009 Cavallini ............ G01K 3/04
422/400
2010/0207301 A1 * 8/2010 Suh ................ B29C 66/73921
264/447
(Continued)

FOREIGN PATENT DOCUMENTS

WO    WO-2017167798 A1 * 10/2017 ............ B01J 13/04

OTHER PUBLICATIONS

United States Notice of Allowance dated Mar. 1, 2019, in U.S. Appl. No. 15/977,046.
(Continued)

*Primary Examiner* — Jennifer Wecker
(74) *Attorney, Agent, or Firm* — Joseph Petrokaitis, Esq.; McGinn I.P. Law Group, PLLC.

(57) ABSTRACT

A microfluidic device, including a controllable shape-changing micropillar where a shape of the shape-changing micropillar is changed by a fluid.

11 Claims, 6 Drawing Sheets

Related U.S. Application Data continuation of application No. 15/277,889, filed on Sep. 27, 2016, now Pat. No. 10,071,375.

(51) Int. Cl.
  *B81C 1/00* (2006.01)
  *B81B 7/04* (2006.01)
  *F16B 1/00* (2006.01)

(52) U.S. Cl.
  CPC .......... *B81B 1/006* (2013.01); *B81C 1/00111* (2013.01); *B01L 3/502761* (2013.01); *B01L 2200/06* (2013.01); *B01L 2200/0652* (2013.01); *B01L 2200/0668* (2013.01); *B01L 2200/12* (2013.01); *B01L 2300/0645* (2013.01); *B01L 2300/123* (2013.01); *B01L 2400/0661* (2013.01); *B01L 2400/082* (2013.01); *B01L 2400/086* (2013.01); *B81B 2201/058* (2013.01); *B81B 2203/0361* (2013.01); *F16B 1/0014* (2013.01)

(58) Field of Classification Search
  CPC ....... B01L 2300/0645; B01L 2300/123; B01L 2400/0661; B01L 2400/082; B01L 2400/086; B01L 3/502707; B01L 3/502715; B01L 3/502746; B01L 3/502761; B81B 1/006; B81B 2201/058; B81B 2203/0361; B81C 1/00111; F16B 1/0014
  See application file for complete search history.

(56) References Cited

U.S. PATENT DOCUMENTS

2016/0003280 A1* 1/2016 Ashmawi .............. F16B 1/0014
  403/273
2018/0298271 A1* 10/2018 Auzerais ............... E21B 43/267

OTHER PUBLICATIONS

United States Notice of Allowance dated May 7, 2018, in U.S. Appl. No. 15/277,889.

* cited by examiner

RECONFIGURABLE MICROFLUIDIC DEVICE AND METHOD OF MANUFACTURING THE SAME

CROSS-REFERENCE TO RELATED APPLICATIONS

The present application is a Continuation Application of U.S. patent application Ser. No. 15/977,046, filed on May 11, 2018, which is a Continuation Application of U.S. patent application Ser. No. 15/277,889, filed on Sep. 27, 2016, now U.S. Pat. No. 10,071,375, issued on Sep. 11, 2018, the entire contents of which are hereby incorporated by reference.

BACKGROUND

The present invention relates generally to a microfluidic device, and more particularly, but not by way of limitation, to a microfluidic device including a microfluidic channel that is dynamically and reversibly changeable during the microfluidic chip operation.

Conventionally, devices that manipulate fluids in the microscale and nanoscale offer benefits to be used as miniaturized laboratories such as low energy consumption, shorter chemical reaction time, small sample and biological reagents consumption, low cost, high compactness, high integration and the possibility of multiple tests per device. Also, microfluidic-based devices may facilitate remote and touch-less manipulation of single cells, micro-organisms or micro-particles. Common materials used as microfludic chip substrate are silicon, glass or thermoplastic polymers such as polydimethylsiloxane (PDMS) or polymethyl methacrylate (PMMA). Standard semiconductor fabrication technology (photolithography, dry and wet etching, chemical vapor deposition, etc.) is commonly employed to manufacture microfluidic hips on silicon or glass, while methods such as injection molding or hot embossing are employed with thermoplastics.

One common aspect of these fabrication methods is that, once a microfluidic device is built, its characteristics are usually fixed and can no longer be changed. The microchannel layout, dimensions and other channel features such as the presence or absence of obstacles, pillars or surface grooves cannot be modified during chip utilization. That is, once built, the microfluidic device is generally limited to be used on the application for which it was originally designed.

One example where this results in a limitation is for microfluidic structures known as "capillary pumps", usually comprised of a widening structure within the microchannel filled with an array of pillars that is capable of pulling fluid along the channel by means of capillary pressure. In such structures, the flow rate and volume of fluid this structure can remove depends strongly on its geometry, width, size and placement of the pillars, which are fixed by design and cannot be changed once built.

Some microfluidic devices, on the other hand, have considered using a thermorheological solution that forms a gel on heating such that, by selectively using dynamic photomasking, it results in locally gelled regions that act as channel walls. However, these devices require a liquid solution flowing or contained within a microfluidic chamber, which are hard to control in their liquid states and prone to mix with the fluid intended for analysis, and require expensive optical equipment and a photomask to be designed and built every time a change is intended for the microchannels.

SUMMARY

In an exemplary embodiment, the present invention can provide a microfluidic device, including a substrate including a microchannel, an activation setup disposed in the microchannel, and a matrix array of controllable shape-changing micropillars connected to the activation setup. A shape of the controllable shape-changing micropillars changes based on an activation of the activation setup.

In an exemplary embodiment, the present invention can provide a microfluidic device, including a substrate including a microchannel, an activation setup disposed in the microchannel, and a matrix array of controllable shape-changing micropillars connected to the activation setup. A shape of the controllable shape-changing micropillars changes based on an activation of the activation setup.

In another exemplary embodiment, the present invention can provide a microfluidic device, including a microchannel, a plurality of activation setups disposed in the microchannel, and a plurality of groups of controllable shape-changing micropillars, each group of the controllable shape-changing micropillars being connected to a different activation setup of the plurality of activation setups.

In a further exemplary embodiment, the present invention can provide a method of manufacturing a microfluidic device, the method including providing a substrate including a microchannel, depositing an activation setup within the microchannel, and connecting an array of controllable shape-changing micropillars to the activation setup such that a shape of the controllable shape-changing micropillars is selectively changed by activating the activation setup.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which.

DETAILED DESCRIPTION

The invention will now be described with reference to FIG. 1-8C, in which like reference numerals refer to like parts throughout. It is emphasized that, according to common practice, the various features of the drawing are not necessarily to scale. On the contrary, the dimensions of the various features can be arbitrarily expanded or reduced for clarity.

Figure 1:
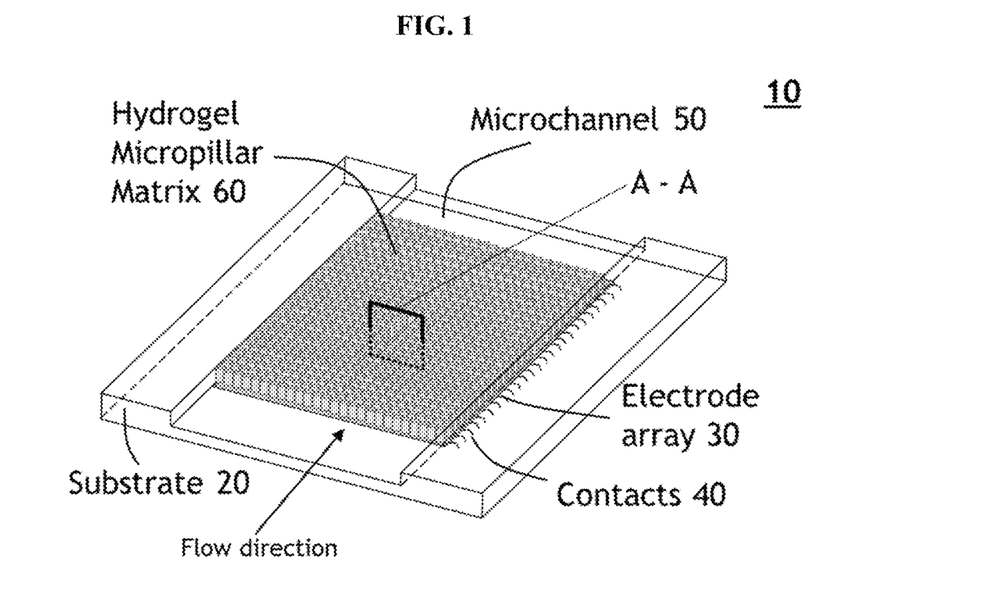
FIG. 1 is a perspective view of one example of a microfluidic device 10.

With reference now to the example depicted in FIG. 1, a microfluidic device 10 includes a substrate 20 and a microchannel 50 in which liquid can flow in the direction depicted in FIG. 1. An electrode array 30 including contacts 40 for electrically connecting the electrode array 30 are disposed in the microchannel 50. A hydrogel micropillar matrix 60 including a plurality of micropillars 60a (as depicted in FIG. 2 which depicts a cross-sectional view A-A of FIG. 1).

That is, a two-dimensional array of polymer micropillars 60a arranged in an N×M matrix is integrated inside the microchannel 50.

Figure 2:
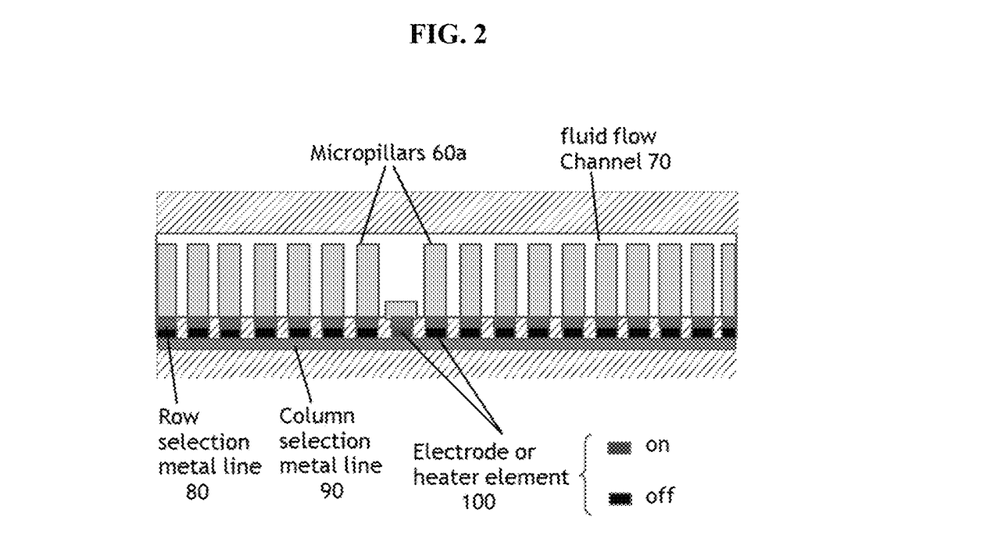
FIG. 2 is a vertical cross-sectional view A-A showing one example of a configuration of the microfluidic device 10.

As shown in FIG. 2, in one possible implementation, the electrode array 30 includes a row selection metal line 80, a column selection metal line 90, and an electrode or heating element 100 associated with each of the micropillars 60a. The fluid flow channel 70 is the region between and around the micropillars 60a for the fluid to flow in the flow direction (as shown in FIG. 1).

Figure 3A:
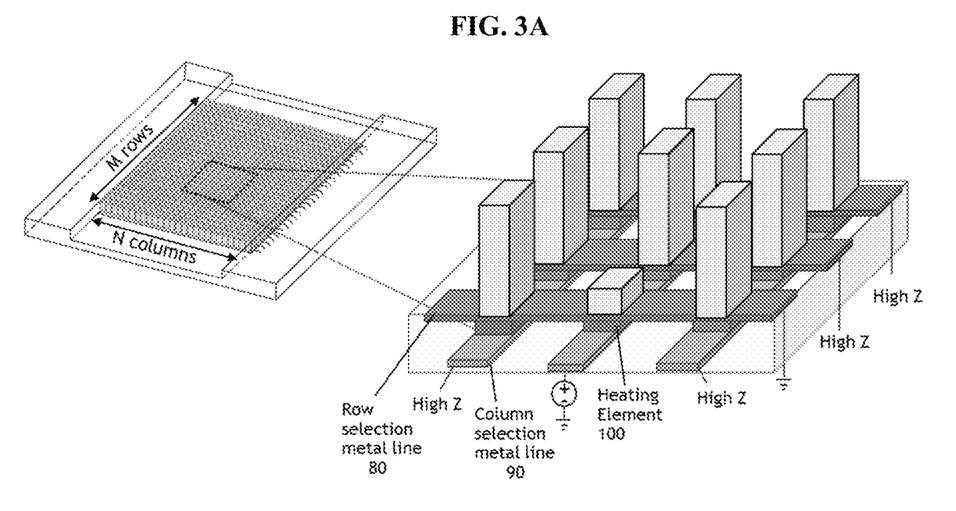
FIG. 3A is a perspective view of an example of electrical connections of the microfluidic device 10.
Figure 3B:
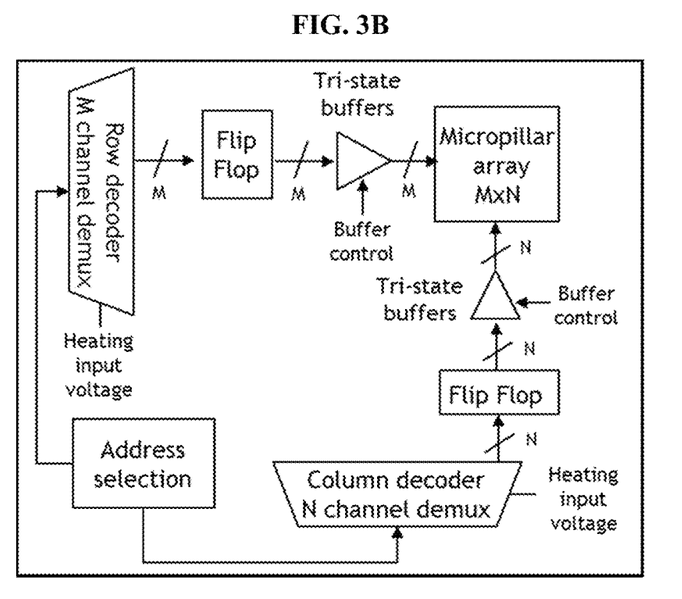
FIG. 3B is an exemplary configuration of the electrical circuitry of the microfluidic device 10.

As shown in FIG. 3A, the electrode or heating element 100 (e.g., activation setup) is disposed between the row selection metal line 80 and the column selection metal line 90 such that the electrode or heating element 100 can be attached to a controlled power source to cause the electrode or heating element 100 to activate (or de-activate) to change the dimensions of the micropillars 60a. High Z means "open electrical connection" or, a high electrical impedance state. Each electrode has three distinctive states (Positive voltage, Ground or High Z), so that voltages can be applied individually on each pillar. That is, the micropillar array 60 of an M×N array is electrically configured with the electrical schematic such as depicted in FIG. 3B so that the electrode or heating element 100 may be activated to configure (or re-configure) a shape of the micropillar array 60. Thereby, each electrode or heating element 100 can be set in an "on" state in which the electrode or heating element 100 emits heat (i.e., resistive heat generated by an electrical current) to cause the micropillar 60a to reduce a height thereof or in an "off" state to cause the micropillar 60a to return to its original shape as shown in FIG. 2.

FIG. 3B exemplarily shows one possible control scheme of an interconnection array, which uses a tri-state voltage polarization scheme (positive voltage, ground and high impedance—High Z) and an individual state storage memory that allows persistence of individual (and selective) size of the micropillars 60a.

In an alternative implementation scheme, a two-dimensional array of electrodes 100 can be used where the electrical contact between the electrode 100 and the power source is done using vertical electrical vias through the microfluidic chip substrate. Alternatively, when the electrode density allows, the electrical contact between each electrode 100 and the power source can be done in-plane on the chip surface. Moreover, CMOS (Complementary metal-oxide-semiconductor) technology can be employed where each electrode 100 in the two-dimensional array is addressed electrically by the corresponding CMOS element in a CMOS array. Also, a hybrid of the approaches can be used. Alternatively, an array of square electrodes As shown in FIG. 2, each micropillar 60a in the hydrogel micropillar matrix 60 can include a corresponding electrode 100 for changing the shape of the individual micropillar 60a. However, the invention is not limited to a one-to-one configuration of electrode 100 to micropillar 60a. That is, a predetermined array of micropillars 60a can correspond to one electrode 100 (e.g., a plurality of micropillars-to-one electrode). In another embodiment, the micropillars 60a can be arranged to correspond to the electrodes in a predetermined shape such that activating an electrode to the "on" state causes the micropillar array 60 to be configured in the predetermined shape. In other words, the micropillars 60 may be arranged in the microchannel 50 where each micropillar 60a can be individually addressed (or as a group or plurality of micropillars) and a height of the micropillars 60a is controlled such that the geometry of the microchannel 50 can be modified dynamically and reversibly during the microfluidic chip operation by use of the electrode 100. Thus, a system including a two-dimensional array of micropillars 60a arranged and aligned above a corresponding array of electrodes 100 is provided.

For example, a plurality of groups of controllable shape-changing micropillars 60a can be connected to the activation setup (e.g., heater) 100 such that the group of controllable shape-changing micropillars 60a changes shape when the corresponding activation setup is activated. It is noted that a plurality of activation setups can be provided corresponding to different groups of controllable shape-changing micropillars 60a.

Thus, by controlling the electric field or the temperature gradient in the micropillars 60a, a size (i.e., the height) of the micropillar 60a can be selectively changed. This provides an extremely flexible and adaptive microfluidics structure, suitable for trapping and sorting microparticles, mixing fluids, flow control, etc.

In some embodiments, the micropillars 60 are based on either a thermoresponsive hydrogel or an electroactive polymer that can change size in response to a temperature gradient or an applied electric field, respectively. The electrode 100 acts on the micropillars 60 such that the geometry (i.e., height) of the micropillars 60 is selectively changed, which can affect the flow of the particles suspended in the fluid as well as the fluid flow characteristics themselves.

It is noted that the material of the micropillars is not limited to the above. The material of the micropillars 60 can include, for example, thermoresponsive hydrogel polymer, dielectric elastomers, a piezoelectric ceramic, etc. That is, the micropillars 60 include a suitable controllable shape-changing material.

For example, temperature-controlled micropillars 60 (i.e., via the heater electrode or element 100) can be made of a thermoresponsive hydrogel polymer such as poly(N-isopropylacrylamide). That is, the hydrogel requires an aqueous medium during growth and the flowing fluid helps maintain a stable base temperature. When the thermoresponsive hydrogel polymer is heated above a critical temperature, it releases water, and then the micropillars shrunk (i.e., the height decreases). In one embodiment, the micropillar aspect ratio (H/D) is less than one. This may increase robustness of the micropillar 60a.

In other embodiments, electric field-controlled micropillars comprising a dielectric elastomer such as silicone or acrylic elastomers can be used for the micropillars 60. The electroactive polymer requires voltages of the order of 100 V/μm, but are not in contact with the fluid or the particles, minimizing the risk of damaging biological elements flowing in the fluid.

In some embodiments, voltage controlled micropillars using a piezoelectric ceramic, such as PZT (Lead zirconate titanate) can be used for the micropillars 60. As exemplarily shown in FIGS. 6A and 6B, usage of a piezoelectric ceramic, such as PZT (Lead zirconate titanate), can allow careful control of pillar height or channel segment height. Applying carefully controlled voltages between the metal contacts 61 allows control of the piezoelectric ceramic micropillars height 60.

It is noted that the heating element 100 as seen in FIG. 3A can be composed of a triple layer structure, the layers may comprise aluminum, polycrystalline silicon, aluminium or a suitable combination of metal-electrical resistive material-metal. The metal used in the first interconnection layer does not need to be the same metal of the third metal layer (i.e., the first layer can be aluminum and the third layer can be a different metal, such as gold, copper, palladium, etc).

Figure 4A:
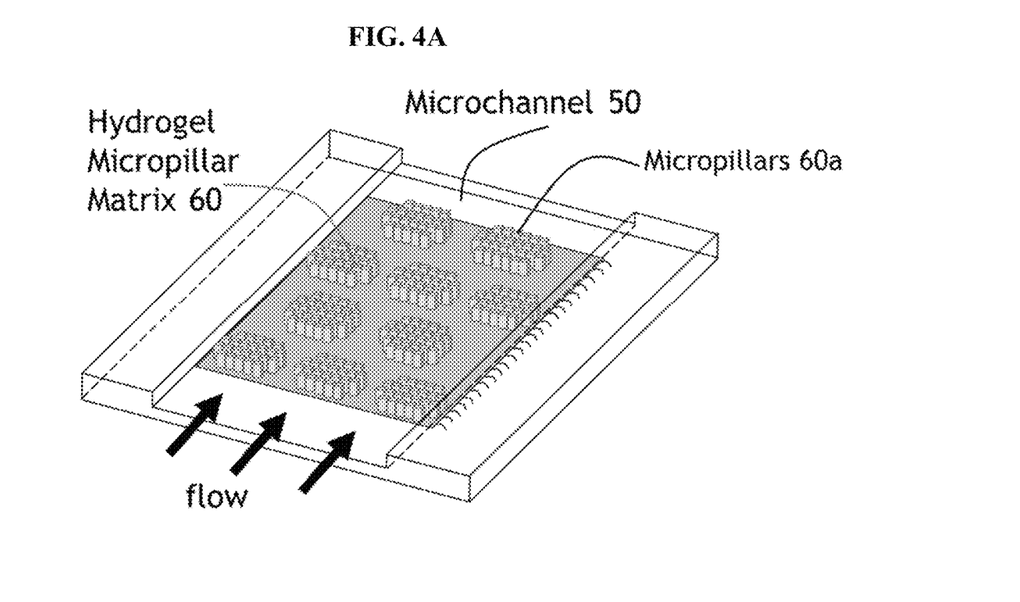
FIGS. 4A-4B are an exemplary configuration of the microfluidic device 10 according to one exemplary embodiment.
Figure 4B:
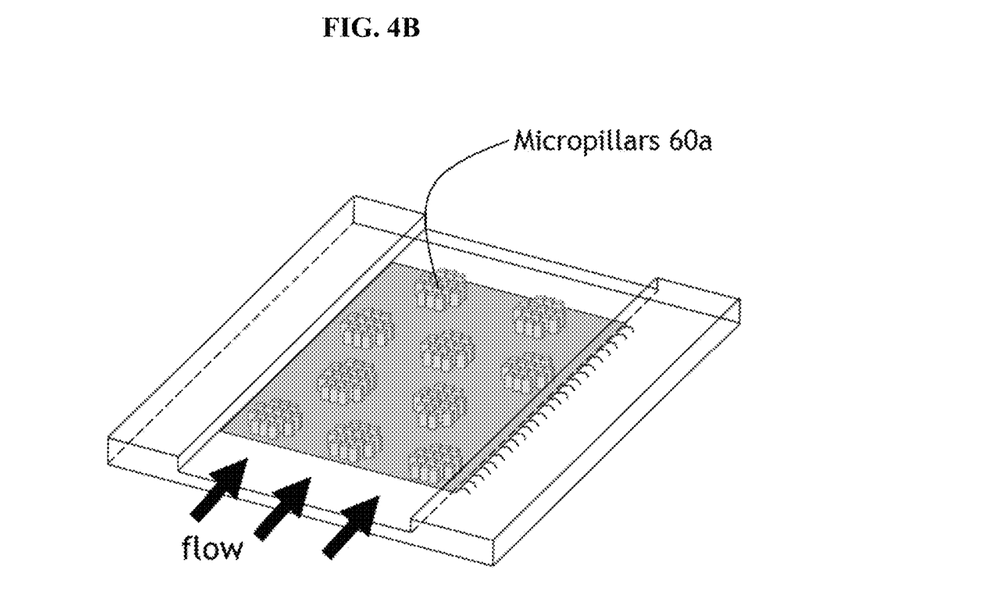

FIG. 4A and FIG. 4B exemplarily depict a first use case of the invention for flow control with a tunable channel. In one embodiment, the width of a portion of the channel is adjusted by activating particular electrodes 100 to cause the micropillars to reduce (or increase) height, thereby causing the channel to become wider or narrower, thus inducing changes in the flow speed or even completely blocking the flow. In an alternative implementation shown in FIG. 4A and FIG. 4B, the flow rate can be controlled by the geometry (e.g., shape) of the obstacles comprising a microfluidic capillary pump (usually in the form of micropillars) located on a section of the microchannel. Thus, microfluidic chips with adjustable permeability that can change during the same experiment realization for systematic studies can be enabled. For example, the mean distance between pillars of the microchannel 50 is increased from FIG. 4A to FIG. 4B, thereby to change flow rate by activating particular electrodes 100 to change the shape of the micropillars 60a.

Figure 5:
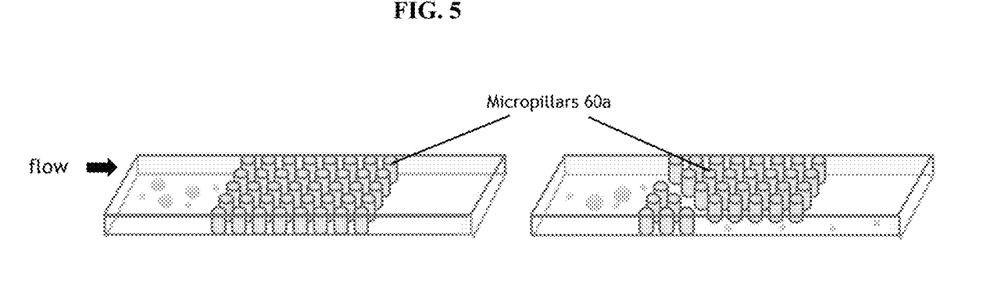
FIG. 5 is an exemplary configuration of the microfluidic device according to another exemplary embodiment.
Figure 6A:
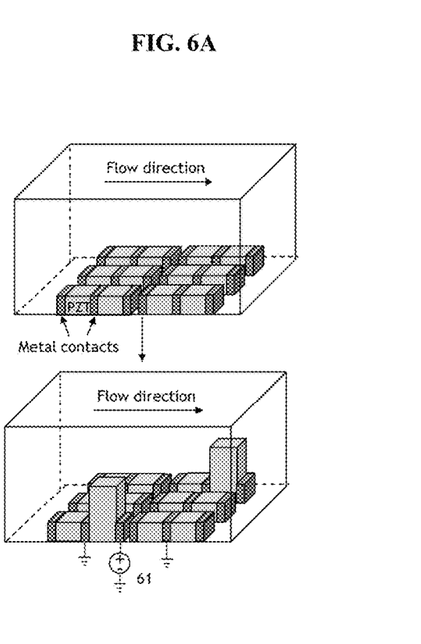
FIGS. 6A-6B exemplary depict an embodiment of the invention including piezoelectric ceramic micropillars 60.
Figure 6B:
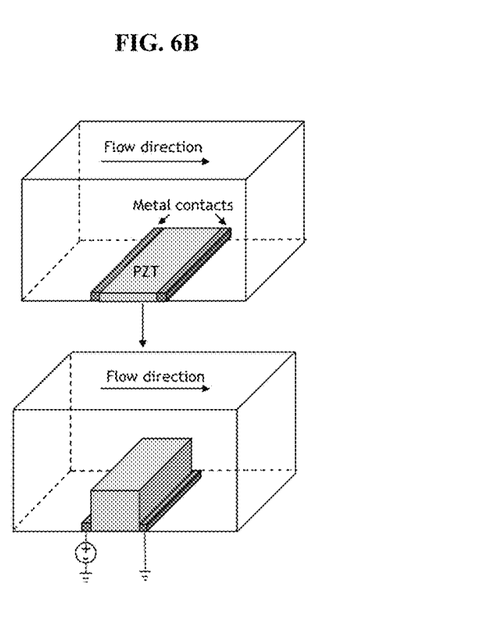

FIG. 5 exemplary depicts a second use case of the invention for particle manipulation and sorting with adjustable obstacles. Without voltage in any of N×M matrix elements, all the micropillars are at maximum height. By applying a voltage in selected pixels from the array, it is possible to create a new conformation of micropillars for desired application such as allowing smaller particles to flow through the array while retaining larger particles. The invention can be used to dynamically recreate and adjust so-called deterministic lateral displacement structures [Lab Chip, 2007, 7, 1644-1659] where rows of obstacles slightly shifted laterally allow small particles to follow the laminar flow streams, whereas large particles are continuously forced to change the laminar flow stream and are thus continuously displaced and separated from the smaller particles.

Figure 7:
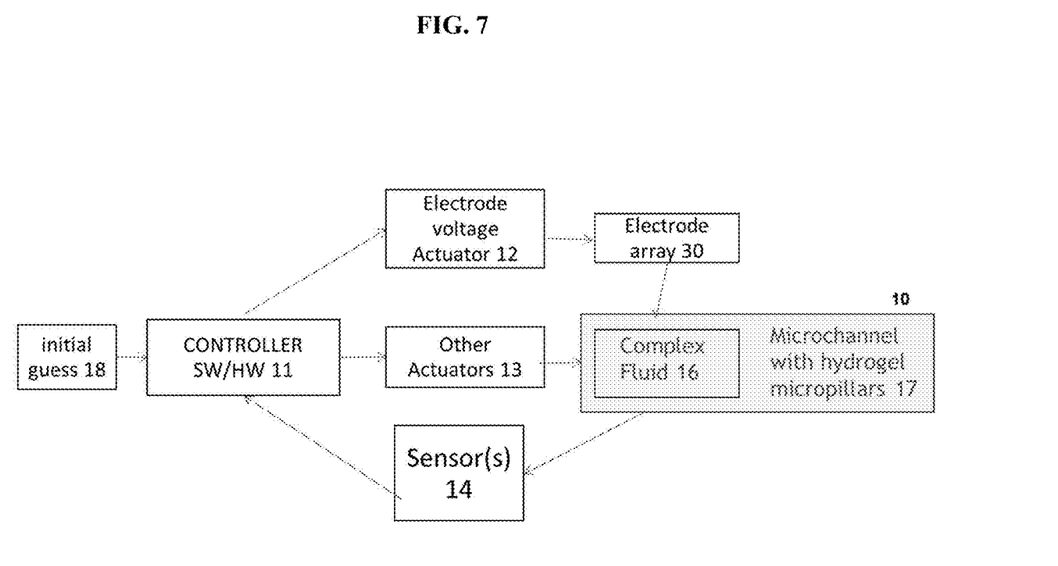
FIG. 7 depicts a block/flow diagram of a fluid manipulation process according to an embodiment of the disclosure.

A system according to an illustrative embodiment of the disclosure is depicted in FIG. 7 and includes (1) a passive part and (2) an active part. Referring now to FIG. 7, a passive part (e.g., the microfluidic device 10) according to an embodiment of the disclosure includes a simple or complex fluid 16 flowing in a microchannel 17 including the hydrogel micropillar matrix 60 as exemplarily depicted in FIG. 1. The flow can be driven by any external force, such as forces generated by a micropipette, a pressure pump, a syringe pump, a capillary pump/pressure, gravity, etc. A complex fluid can be a binary mixture or an emulsion/colloid in which particles, such as solid beads, liquid droplets, cells, etc., with known properties, including size, chemical composition, morphology, surface functionalization, etc., are dispersed in the continuous, simple fluid phase.

An active part (e.g., the electrode array 30 and control thereof) according to an embodiment of the disclosure includes a controller unit 11 that includes both hardware and software, a electrode voltage actuator 12 that drives the activation of each electrode 100 in the electrode array 30, one or more sensor components 14 as well as other type of actuators 13 that operate directly on the hydrogel micropillar matrix 60 and fluid. The controller unit 11 initializes operation of the electrode voltage actuator 12 and other actuators 13 based on receipt of an initial best guess 18 of operational parameters of the micropillar 60a of the hydrogel micropillar matrix 60 to change a shape of the micropillars 60a. The electrode voltage actuator 12 can manipulate the shape of the micropillars 60a of the hydrogel micropillar matrix 60. Other actuators 13 can affect other characteristics of the microfluidic device or the fluid, such as temperature or flow speed. The sensor component(s) measures and/or quantifies the outcome of the manipulation, represented by the values of properties of the fluid or the particles. The hardware element of the controller unit can include devices such as a circuit board with a microprocessor/microcontroller (hereinafter referred to as a CPU), signal generators and amplifiers to control the operation of the various actuators, as well as analyze the sensor readings. The software component can execute an optimization routine to determine the state of the actuators that best manipulates the fluid based on the signals from the sensor or sensors. The optimization routine can be based on one or more well-known techniques such as genetic algorithms, or other less known or customized methods, to perform iterative optimization, self-tuning or active control of the pillar distribution by minimizing/maximizing the readings of the sensor. A control-loop can also be employed to adapt the system to further changes in the operation conditions, such as flow rate, temperature, etc.

Figure 8A:
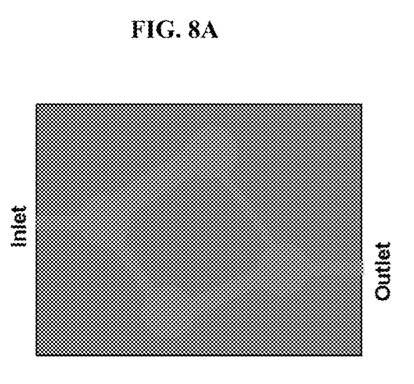
FIGS. 8A-8C exemplarily depicts a reconfigurable rock-on-chip design using the micropillars 60a of the microfluidic device 10.
Figure 8B:
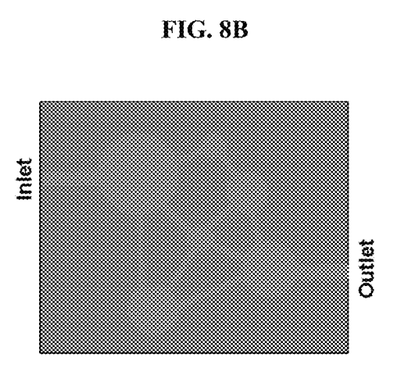
Figure 8C:
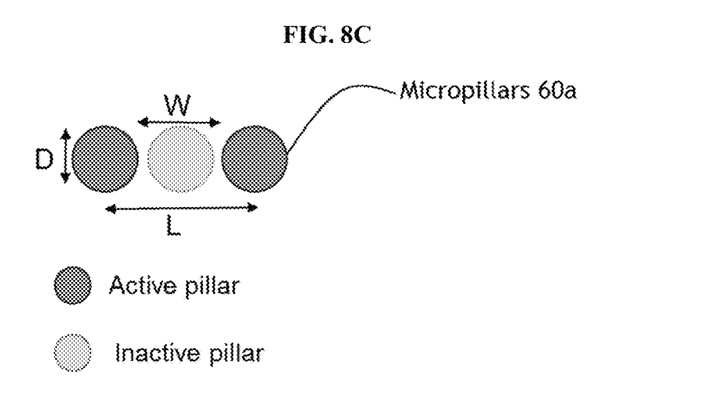

In some embodiments, as exemplarily depicted in FIGS. 8A-C, the controllable shape-changing micropillars 60a can create "live" designs to allow for the manufacturing of a reconfigurable rock-on-chip layout that can be made to mimic different types of porous media. By loading different pore/throat size distributions and pore connectivity the reconfigurable porous media can be made to represent either a sandstone, carbonate, shale rock, etc. FIG. 8A exemplarily depicts a "Rock Type A" including similar pore sizes, large throat size variability, and low pore connectivity while FIG. 8B exemplarily depicts a "Rock type B" including large pore size variability, similar throat sizes, and high pore connectivity.

As shown in FIG. 8C, pore channels in reservoir rocks may range from a few nanometers to tens of micrometers. The base layout of the micropillar array 60 can have appropriate dimensions (diameter D and pitch L) to allow such geometries to be created. The smallest channel width a micropillar matrix can generate is given by $W=L-D$. The particle size should be, typically, one order of magnitude smaller than the minimum width W, so as not to clog the passage. The typical flow rate in those devices should be of the order of a few micrometers per second, which represents the scenario in reservoir rocks. That is, by changing the shape (e.g., height) of the micropillars 60a, the pore channels in reservoir rocks can be formed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, Applicant's intent is to encompass the equivalents of all claim elements, and no amendment to any claim of the present application should be construed as a disclaimer of any interest in or right to an equivalent of any element or feature of the amended claim.

What is claimed is:

1. A controllable shape-changing micropillar, wherein a shape of the shape-changing micropillar is changed by a fluid.

2. A method of manufacturing a controllable shape-changing micropillar, the method comprising:
providing a controllable shape-changing micropillar such that a shape of the shape-changing micropillar is changed by a fluid.

3. A microfluidic device, comprising:
a controllable shape-changing micropillar, wherein a shape of the shape-changing micropillar is changed by a fluid.

4. The microfluidic device of claim 3, wherein the fluid flows through a microchannel.

5. The microfluidic device of claim 3, wherein the fluid moves through a microchannel in a predetermined direction.

6. The microfluidic device of claim 3, wherein the fluid moves through a microchannel in a predetermined direction to control the shape of the micropillar.

7. The microfluidic device of claim 3, wherein the fluid moves around the shape of the shape-changing micropillar through a microchannel in a predetermined direction to control the shape of the micropillar.

8. The microfluidic device of claim 4, wherein the controllable shape-changing micropillar is integrated inside the microchannel.

9. The microfluidic device of claim 5, wherein the controllable shape-changing micropillar is integrated inside the microchannel.

10. The microfluidic device of claim 6, wherein the controllable shape-changing micropillar is integrated inside the microchannel.

11. The microfluidic device of claim 7, wherein the controllable shape-changing micropillar is integrated inside the microchannel.

* * * * *